(12) United States Patent
Chen et al.

(10) Patent No.: US 8,927,356 B1
(45) Date of Patent: Jan. 6, 2015

(54) REMOVAL OF NITRIDE BUMP IN OPENING REPLACEMENT GATE STRUCTURE

(71) Applicant: GLOBALFOUNDRIES Inc., Grand Cayman (KY)

(72) Inventors: Tsung-Liang Chen, Cohoes, NY (US); Hsin-Neng Tai, Clifton Park, NY (US); Huey-Ming Wang, Ballston Lake, NY (US); Puneet Khanna, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/919,645

(22) Filed: Jun. 17, 2013

(51) Int. Cl.
  *H01L 29/66* (2006.01)
  *H01L 21/8238* (2006.01)
  *H01L 21/28* (2006.01)
  *H01L 21/3065* (2006.01)

(52) U.S. Cl.
  CPC .. *H01L 21/823828* (2013.01); *H01L 21/28017* (2013.01); *H01L 21/3065* (2013.01)
  USPC ............. 438/191; 438/73; 438/151; 438/229; 438/282; 438/301; 257/347; 257/351; 257/355; 257/360; 257/365

(58) Field of Classification Search
  CPC ... H01L 27/1104; H01L 29/435; H01L 29/49; H01L 29/6659; H01L 29/783
  See application file for complete search history.

(56) References Cited

U.S. PATENT DOCUMENTS 7,157,374 B1 * 1/2007 Waite et al. ............... 438/689

* cited by examiner

*Primary Examiner* — Kyoung Lee
(74) *Attorney, Agent, or Firm* — Ditthavong & Steiner, P.C.

(57) ABSTRACT

Methods for opening polysilicon NFET and PFET gates for a replacement gate process are disclosed. Embodiments include providing a polysilicon gate with a nitride cap; defining PFET and NFET regions of the polysilicon gate, creating a nitride bump on the nitride cap; covering the nitride cap to a top of the nitride bump with a PMD; performing a 1:1 dry etch of the PMD and the nitride bump; and performing a second dry etch, selective to the nitride cap, down to the top surface of the polysilicon gate. Other embodiments include, after creating a nitride bump on the nitride cap, recessing the PMD to expose the nitride cap; covering the nitride cap and the nitride bump with a nitride fill, forming a planar nitride surface; and removing the nitride fill, nitride bump, and nitride cap down to the polysilicon gate.

20 Claims, 6 Drawing Sheets

FIG. 1A
BACKGROUND

FIG. 1B
BACKGROUND

FIG. 1C
BACKGROUND

FIG. 1D
BACKGROUND

FIG. 1F
BACKGROUND

FIG. 1E
BACKGROUND

REMOVAL OF NITRIDE BUMP IN OPENING REPLACEMENT GATE STRUCTURE

TECHNICAL FIELD

The present disclosure relates to manufacture of semiconductor devices, and more particularly to manufacture of replacement gate NFETs and PFETs.

BACKGROUND

Figure 1A:
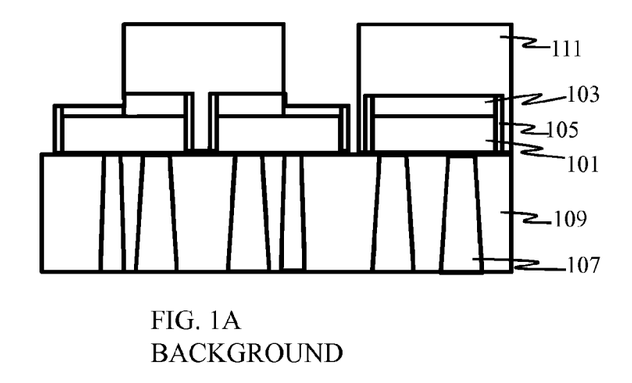
FIGS. 1A through 1F schematically illustrate conventional formation of replacement gates for NFETs and PFETs and formation of nitride bumps.
Figure 1B:
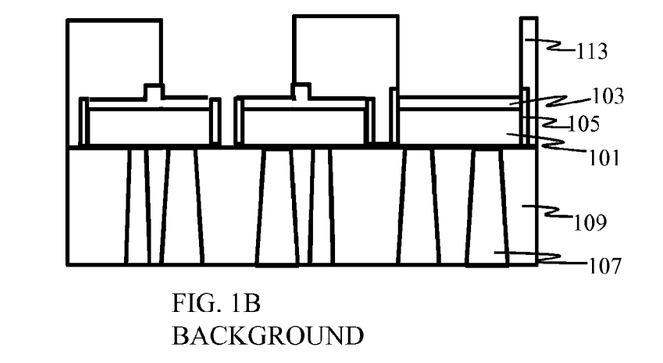
Figure 1C:
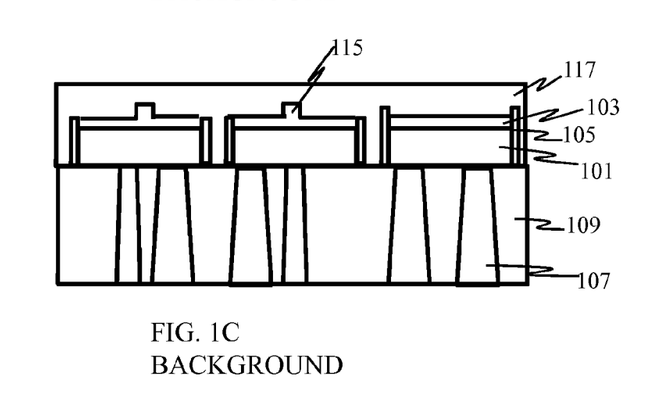
Figure 1D:
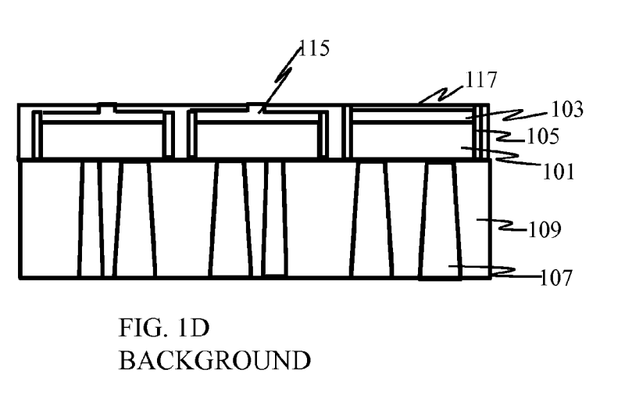
Figure 1E:
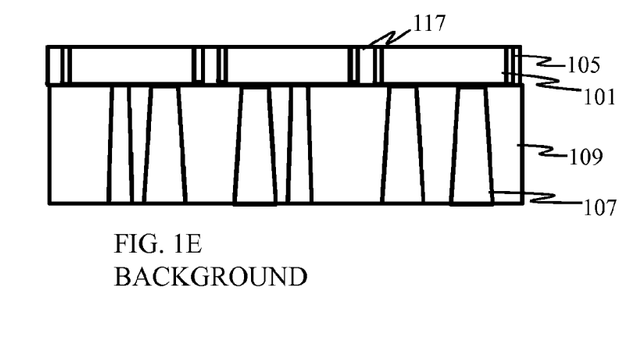

During formation of replacement gates for NFETs and PFETs, first one area (e.g., the PFET) is masked off over a nitride cap to define the second area (e.g., the NFET), and a portion of the nitride cap over the second area is removed. Then the second area is masked off over the remaining nitride cap of the second area to define the first area. In the process, a portion of the nitride cap for the first area is removed. Where the masks used to define the NFET and PFET areas overlap, a nitride bump is formed. For example, as illustrated in FIG. 1A, polysilicon gates 101 (or dummy gates 101) are formed with nitride caps 103 between spacers 105 on a silicon substrate 107 with shallow trench isolation (STI) regions 109 formed therein. Nitride caps 103 may be formed, for example of silicon nitride (SiN). A TJ mask 111 is formed over the PFET regions with openings to define the NFET regions, and a portion of the nitride caps 103 is etched away. Then, as illustrated in FIG. 1B, the TJ mask 111 is removed, and an RG mask 113 is formed over the NFET regions with openings to define the PFET regions. Again a portion of the nitride caps 103 is etched away, leaving nitride bumps 115. Adverting to FIG. 1C, RG mask 113 is removed, and a premetal dielectric (PMD) 117 of an oxide, for example silicon oxide (SiO), is deposited over the entire substrate. A first chemical mechanical polishing (CMP) is performed down to the nitride bumps 115, and a second CMP and buff are performed to remove the nitride bumps, as illustrated in FIG. 1D. Then the remaining nitride of the nitride caps 103 is removed by reactive ion etching (RIE) or remote plasma nitride etch to reveal the polysilicon gates 101 for forming the replacement gates.

Figure 1F:
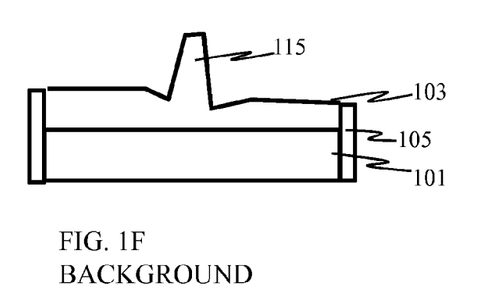

The size of the nitride bumps depends on the amount of TJ/RG mask overlap and, therefore, varies. In addition, a higher etch amount occurs at the edges of the TJ and RG masks, resulting in a large variation in nitride cap thickness after PFET/NFET definition, as shown in FIG. 1F. Use of the CMP buff to remove the nitride bumps will cause large dishing in the iso/wide STI regions. Also, a large overetch is needed during the nitride RIE or remote plasma nitride etch to ensure complete nitride removal and successful opening of the polysilicon gates.

A need therefore exists for methodology enabling improved control of non-uniformity etch rate and gate height, and the resulting device.

SUMMARY

An aspect of the present disclosure is a method of opening up the nitride cap for a replacement gate process by adding an extra 1:1 oxide:nitride dry etch before a nitride selective dry etch for nitride bump removal.

Another aspect of the present disclosure is a method of opening up the nitride cap for a replacement gate process by adding an extra 1:1 oxide:nitride dry etch and an oxide selective dry etch before a nitride selective dry etch for nitride bump removal.

Another aspect of the present disclosure is a method of opening up the nitride cap for a replacement gate process by performing an oxide recess, nitride fill, and nitride dry etch.

Another aspect of the present disclosure is a method of opening up the nitride cap for a replacement gate process by performing an oxide recess, nitride fill, and nitride CMP.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a polysilicon gate with a nitride cap on a top surface thereof; defining PFET and NFET regions of the polysilicon gate, creating a nitride bump on a top surface of the nitride cap; covering the nitride cap to a top of the nitride bump with a pre-metal dielectric (PMD); performing a first dry etch including a 1:1 dry etch of the PMD and the nitride bump; and performing a second dry etch, selective to the nitride cap, down to the top surface of the polysilicon gate.

Aspects of the present disclosure include the PMD including an oxide. Further aspects including the first dry etch including a SiCoNi etch, a remote plasma dry etch, or a reactive ion etch (RIE). Other aspects include performing the first dry etch at an etch rate of 30 to 150 nanometers (nm)/minute. An additional aspect includes performing the first dry etch to a depth of 30 to 50 nm. Another aspect includes the second dry etch including a nitride RIE or a remote plasma dry etch. A further aspect includes performing the second dry etch at an etch rate of 30 to 150 nm/minute. Additional aspects include removing all PMD and a portion of the nitride cap during the first dry etch, forming a substantially planar nitride surface. Another aspect includes performing a third dry etch, selective to the PMD, prior to performing the second dry etch, to remove any remaining PMD. A further aspect includes performing the third dry etch at an etch rate of 30 to 150 nm/minute.

Another aspect of the present disclosure is a method including: providing a polysilicon gate with a nitride cap on a top surface thereof; defining PFET and NFET regions of the polysilicon gate, creating a nitride bump on a top surface of the nitride cap; recessing the PMD to expose the nitride cap; covering the nitride cap and the nitride bump with a nitride fill, forming a planar nitride surface; and removing the nitride fill, nitride bump, and nitride cap down to the polysilicon gate.

Aspects include the PMD including an oxide. Other aspects include recessing the oxide to a depth of 5 to 50 nm. A further aspect includes recessing the oxide by a dry etch or a wet etch. Additional aspects include the nitride fill including high density plasma (HDP) nitride, conformal film deposition (CFD) nitride, plasma enhanced chemical vapor deposition (PECVD) nitride, iRAD nitride, or silicon carbon nitride (SiCN). Another aspect includes forming the nitride fill to a thickness of 1 to 2 kilo angstroms (kÅ). Other aspects include removing the nitride fill, nitride bump, and nitride cap by nitride chemical mechanical polishing for 2 to 5 minutes or by a selective nitride dry etch. A further aspect includes the selective dry etch including a nitride reactive ion etch (RIE) or a remote plasma dry etch. An additional aspect includes performing the selective nitride RIE etch at an etch rate of 30 to 150 nm/minute.

Another aspect of the present disclosure is a method including: providing a polysilicon gate with a silicon nitride (SiN) cap on a top surface thereof; defining PFET and NFET regions of the polysilicon gate, creating a nitride bump on a top surface of the SiN cap; covering the SiN cap to a top of the nitride bump with an oxide pre-metal dielectric (PMD); performing a 1:1 dry etch of the oxide PMD and the nitride bump by a SiCoNi etch, a remote plasma dry etch, or a reactive ion etch (RIE), at an etch rate of 30 to 150 nanometers (nm)/minute to a depth of 30 to 50 nm; performing a second dry etch, selective to the oxide PMD, at an etch rate of 30 to 150 nm/minute, to remove any remaining PMD; and performing a third dry etch, selective to the SiN cap, by a nitride RIE or a remote plasma dry etch, at an etch rate of 30 to 150 nm/minute, down to the top surface of the polysilicon gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of dishing in the iso/wide STI regions and the need for a large overetch to ensure complete nitride removal over polysilicon gates attendant upon removing nitride bumps and preparing the polysilicon gates for a replacement gate process. In accordance with embodiments of the present disclosure, an extra 1:1 oxide:nitride dry etch is added for nitride bump removal or the oxide PMD is recessed to expose the entire nitride cap and nitride is deposited to overfill the gap, to form a substantially planar nitride surface, and then the nitride is selectively removed.

Methodology in accordance with embodiments of the present disclosure includes providing a polysilicon gate with a nitride cap on a top surface, defining PFET and NFET regions of the polysilicon gate, creating a nitride bump on a top surface of the nitride cap, and covering the nitride cap to a top of the nitride bump with a pre-metal dielectric (PMD). Then, a first dry etch including a 1:1 dry etch of the PMD and the nitride bump is performed followed by a second dry etch, selective to the nitride cap, down to the top surface of the polysilicon gate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
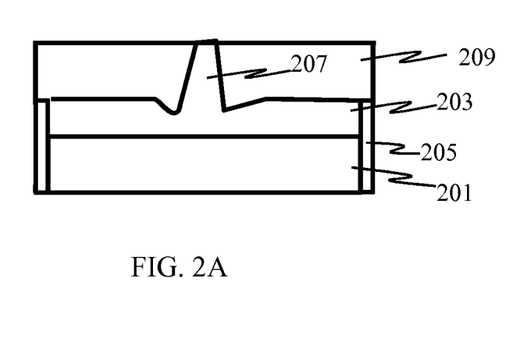
FIG. 2A through 2C schematically illustrate sequential steps of a method, in accordance with an exemplary embodiment.
Figure 2B:
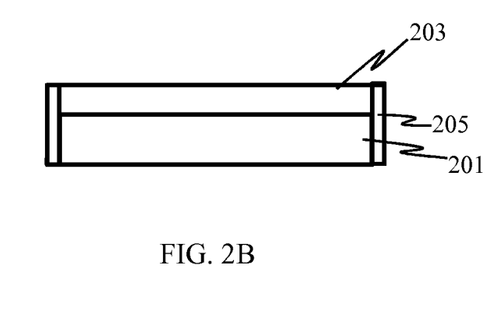
Figure 2C:
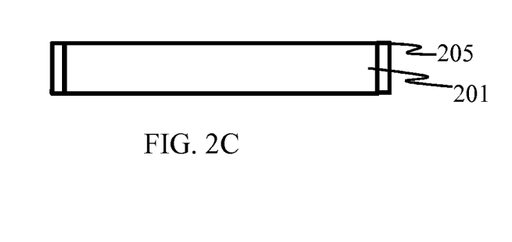

FIGS. 2A through 2C schematically illustrate sequential steps of a method in accordance with an exemplary embodiment. Adverting to FIG. 2A, PFET and NFET regions are formed on polysilicon gate 201 with nitride cap 203 (for example of SiN) and spacers 205, forming nitride bump 207, similar to FIGS. 1A and 1B. PMD 209 is deposited over nitride cap 203 and nitride bump 207, filling all spaces. PMD 209 may be formed of an oxide, for example, of SiO. CMP is then performed, stopping on nitride bump 207.

As illustrated in FIG. 2B, nitride bump 207 is removed by performing a one-to-one (1:1) dry etch of the PMD 209 oxide and nitride cap 203 nitride, removing 30 to 50 nm of material. For example, the dry etch may be SiCoNi, a remote plasma dry etch, such as chemical oxide removal (COR) or Frontier, or RIE. The dry etch time depends on the bump height or remaining oxide thickness, which may range from 5 to 50 nm, and the etch rate may be 30 to 150 nm/minute.

A nitride selective dry etch, such as Frontier or nitride RIE, is next performed to open the nitride cap 203 and expose the polysilicon gate, as illustrated in FIG. 2C. The nitride selective dry etch time depends on the remaining nitride cap thickness, which may range from 20 to 40 nm, and the etch rate may be 30 to 150 nm/minute. Once the nitride is removed, a conventional replacement metal gate process may proceed, i.e., polysilicon gate 201 may be removed and replaced with a replacement metal gate (not shown for illustrative convenience).

Adverting to FIGS. 3A through 3D, sequential steps of a method in accordance with another exemplary embodiment are illustrated. PFET and NFET regions are formed on polysilicon gate 301 with nitride cap 303 (for example of SiN) and spacers 305, forming nitride bump 307, similar to the process described for FIG. 2A. PMD 309 is deposited over nitride cap 303 and nitride bump 307, filling all spaces. PMD 309 may be formed of an oxide, for example, of SiO. CMP is then performed, stopping on nitride bump 307.

Figure 3A:
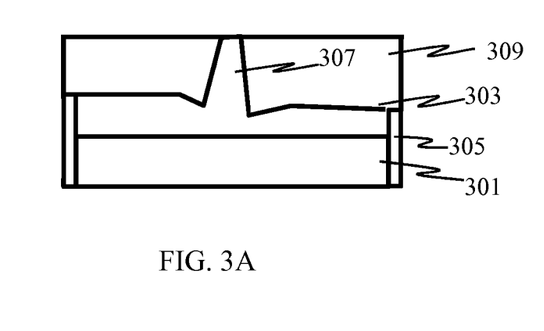
FIGS. 3A through 3D schematically illustrate sequential steps of a method, in accordance with another exemplary embodiment.
Figure 3B:
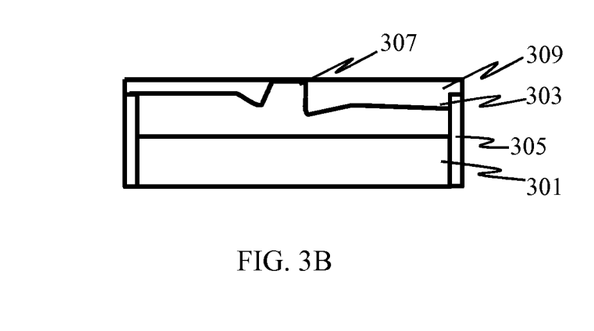

As illustrated in FIG. 3B, nitride bump 307 is removed by performing a 1:1 dry etch of the PMD 309 oxide and nitride cap 303 nitride. For example, the dry etch may be SiCoNi, a remote plasma dry etch, such as COR or Frontier, or RIE. The dry etch time depends on the bump height or remaining oxide thickness, which may range from 5 to 50 nm, and the etch rate may be 30 to 150 nm/minute.

Figure 3C:
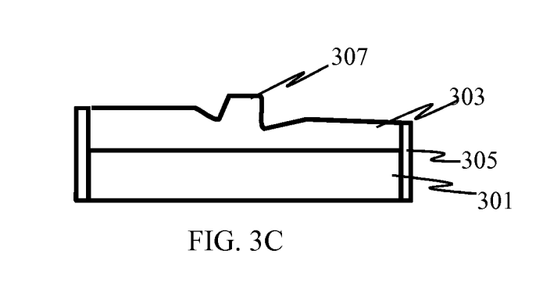

Adverting to FIG. 3C, an oxide selective dry etch is performed to ensure complete removal of PMD 309. The oxide selective dry etch may be SiCoNi, COR, Frontier, or oxide RIE, and may remove less than 10 nm. The selective oxide etch rate may be 30 to 150 nm/minute.

Figure 3D:
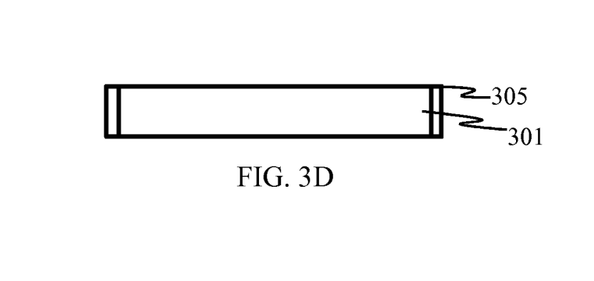

Once all oxide has been removed, a nitride selective dry etch, such as nitride RIE or Frontier, may be performed to open up the nitride cap 303 and expose the polysilicon gate, as illustrated in FIG. 3D. The nitride selective dry etch time depends on the remaining nitride cap thickness, which may range from 20 to 40 nm, and the etch rate may be 30 to 150 nm/minute. Once the nitride is removed, a conventional replacement metal gate process may proceed, i.e., polysilicon gate 301 may be removed and replaced with a replacement metal gate (not shown for illustrative convenience).

A nitride selective dry etch, such as Frontier or nitride RIE, is next performed to open the nitride cap 303 and expose the polysilicon gate, as illustrated in FIG. 3D. The nitride selective dry etch time depends on the remaining nitride cap thickness, which may range from 20 to 40 nm, and the etch rate may be 30 to 150 nm/minute. Once the nitride is removed, a conventional replacement metal gate process may proceed, i.e., polysilicon gate 301 may be removed and replaced with a replacement metal gate (not shown for illustrative convenience).

The embodiments illustrated in and described with respect to FIGS. 2A through 2C and 3A through 3D employ a dry etch process which has better non-uniformity and etch rate control than a buffing CMP. Further less oxide is lost on the iso trench area by using 1:1 oxide/nitride RIE or a short selective oxide RIE. In addition, all processes can be done a single tool or a single chamber.

Figure 4A:
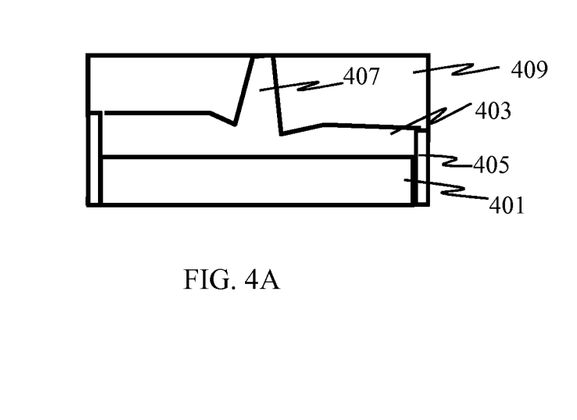
FIGS. 4A through 4D and 5A through 5D schematically illustrate sequential steps of a method, along a y-cut and an x-cut, respectively, in accordance with another exemplary embodiment.
Figure 4B:
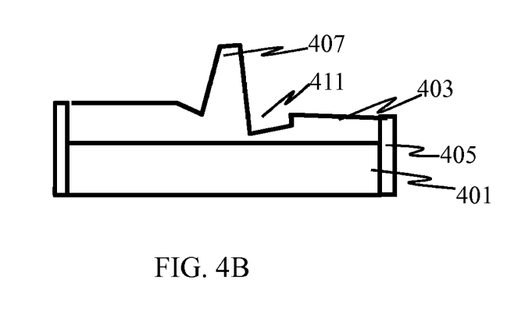
Figure 4C:
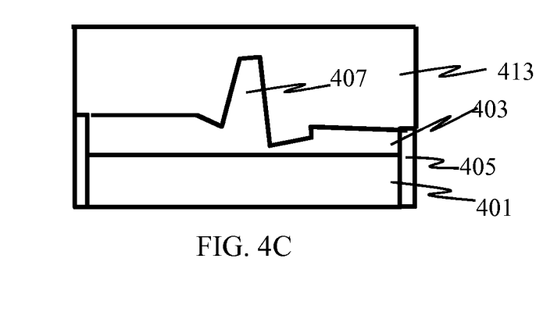
Figure 4D:
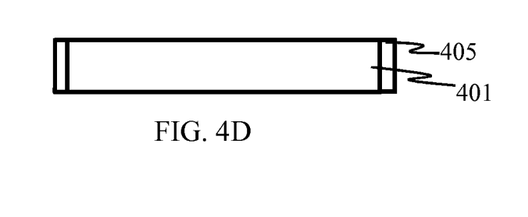
Figure 5A:
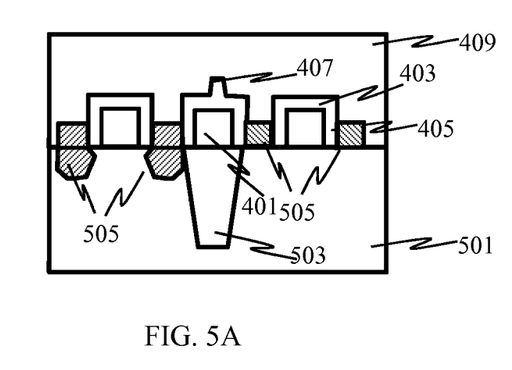

Adverting to FIGS. 4A through 4D and 5A through 5D, sequential steps of a method in accordance with another exemplary embodiment are illustrated along a y-cut and an x-cut respectively. PFET and NFET regions are formed on polysilicon gate 401 with nitride cap 403 (for example of SiN) and spacers 405, forming nitride bump 407, similar to the process described for FIG. 3A. As illustrated in FIG. 5A, gate 401 is formed on substrate 501, over STI region 503, and source/drain regions 505 are formed on opposite sides of gate 401. PMD 409 is deposited over nitride cap 403 and nitride bump 407, filling all spaces. PMD 409 may be formed of an oxide, for example, of SiO. CMP is then performed, stopping on nitride bump 407.

Figure 5B:
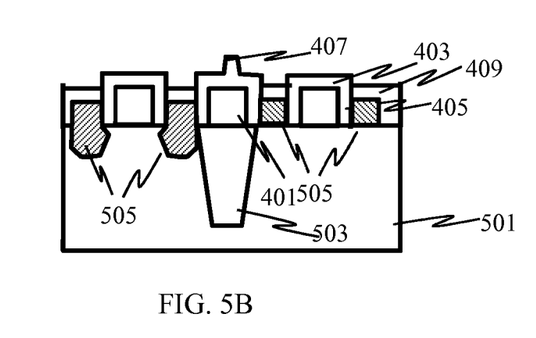

As illustrated in FIGS. 4B and 5B, an oxide recess removes a top portion of PMD 409, revealing the nitride cap 403, and forms recess 411 adjacent nitride bump 407. The oxide recess may, for example, be performed by a dry etch method, such as SiCoNi or SOR, or by a wet etch method, such as with a dilute hydrogen fluoride (dHF), to a depth of 5 to 50 nm, depending on the bump height.

Figure 5C:
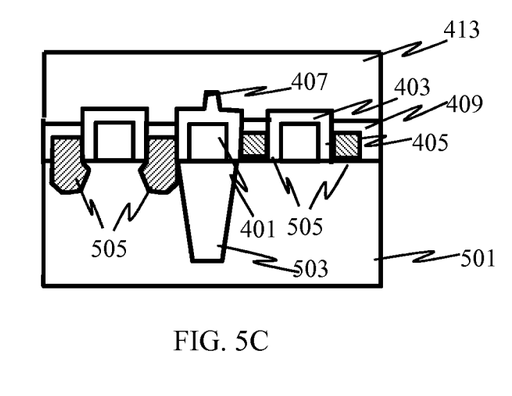

A nitride 413 may then be deposited over the nitride cap 403 and nitride bump 407, overfilling the gap and forming a substantially planar nitride surface, as illustrated in FIGS. 4C and 5C. The nitride 413 may be a high density plasma (HDP) nitride, a conformal film deposition (CFD) nitride, plasma enhanced chemical vapor deposition (PECVD) nitride, iRAD nitride, or silicon carbon nitride (SiCN). The nitride deposition may be performed to a thickness of 1 to 2 kilo angstroms (kA).

Figure 5D:
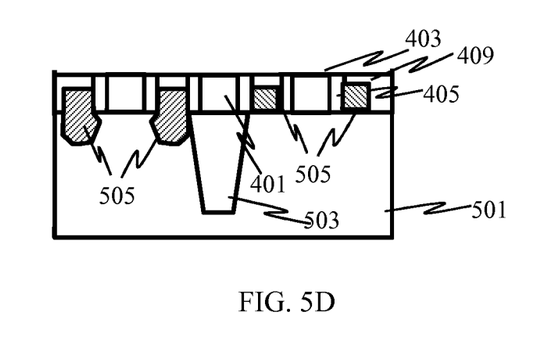

Nitride deposition may then be followed by a nitride CMP, as illustrated in FIGS. 4D and 5D, down to the top surface of the polysilicon gate 401. The nitride CMP may be performed for 2 to 5 minutes, depending on the CMP removal rate and the number of platen. This embodiment has better CMP process control to accommodate all nitride bump sizes as well as a better CMP process margin. In addition, a nitride liner divot is prevented from forming from the nitride RIE process, and there is a positive contribution to gate height control.

Alternatively, the nitride deposition may be followed by a nitride selective dry etch, such as Frontier or nitride RIE, at an etch rate of 30 to 150 nm, instead of a nitride CMP. The nitride selective dry etch has a better non-uniformity and etch rate control than the prior art CMP buff, less oxide loss on the iso trench area, and a positive contribution to gate height control.

The embodiments of the present disclosure can achieve several technical effects, improved non-uniformity and etch rate control, reduced oxide loss on the iso trench area, an ability to perform the entire process in a single tool or chamber, positive contribution to gate height control, improved CMP process margin, and prevention of nitride liner divot. The present disclosure enjoys industrial applicability in any of various types of highly integrated semiconductor devices for which a replacement gate process is employed to form NFETs and PFETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing a polysilicon gate with a nitride cap on a top surface thereof;
defining PFET and NFET regions of the polysilicon gate, creating a nitride bump on a top surface of the nitride cap;
covering the nitride cap to a top of the nitride bump with a pre-metal dielectric (PMD);
performing a first dry etch comprising a 1:1 dry etch of the PMD and the nitride bump; and
performing a second dry etch, selective to the nitride cap, down to the top surface of the polysilicon gate.

2. The method according to claim 1, wherein the PMD comprises an oxide.

3. The method according to claim 2, wherein the first dry etch comprises a SiCoNi etch, a remote plasma dry etch, or a reactive ion etch (RIE).

4. The method according to claim 3, comprising performing the first dry etch at an etch rate of 30 to 150 nanometers (nm)/minute.

5. The method according to claim 3, comprising performing the first dry etch to a depth of 30 to 50 nm.

6. The method according to claim 1, wherein the second dry etch comprises a nitride RIE or a remote plasma dry etch.

7. The method according to claim 6, comprising performing the second dry etch at an etch rate of 30 to 150 nm/minute.

8. The method according to claim 6, comprising removing all PMD and a portion of the nitride cap during the first dry etch, forming a substantially planar nitride surface.

9. The method according to claim 1, further comprising performing a third dry etch, selective to the PMD, prior to performing the second dry etch, to remove any remaining PMD.

10. The method according to claim 9, comprising performing the third dry etch at an etch rate of 30 to 150 nm/minute.

11. A method comprising:
  providing a polysilicon gate with a nitride cap on a top surface thereof;
  defining PFET and NFET regions of the polysilicon gate, creating a nitride bump on a top surface of the nitride cap;
  covering the nitride cap to a top of the nitride bump with a pre-metal dielectric (PMD);
  recessing the PMD to expose the nitride cap;
  covering the nitride cap and the nitride bump with a nitride fill, forming a planar nitride surface; and
  removing the nitride fill, nitride bump, and nitride cap down to the polysilicon gate.

12. The method according to claim 11, wherein the PMD comprises an oxide.

13. The method according to claim 12, comprising recessing the oxide to a depth of 5 to 50 nm.

14. The method according to claim 12, comprising recessing the oxide by a dry etch or wet etch.

15. The method according to claim 11, wherein the nitride fill comprises high density plasma (HDP) nitride, conformal film deposition (CFD) nitride, plasma enhanced chemical vapor deposition (PECVD) nitride, iRAD nitride, or silicon carbon nitride (SiCN).

16. The method according to claim 15, comprising forming the nitride fill to a thickness of 1 to 2 kilo angstroms (kA).

17. The method according to claim 15, comprising removing the nitride fill, nitride bump, and nitride cap by nitride chemical mechanical polishing for 2 to 5 minutes or by a selective nitride dry etch.

18. The method according to claim 17, wherein the selective dry etch comprises a nitride reactive ion etch (RIE) or a remote plasma dry etch.

19. The method according to claim 18, comprising performing the selective nitride RIE etch at an etch rate of 30 to 150 nm/minute.

20. A method comprising:
  providing a polysilicon gate with a silicon nitride (SiN) cap on a top surface thereof;
  defining PFET and NFET regions of the polysilicon gate, creating a nitride bump on a top surface of the SiN cap;
  covering the SiN cap to a top of the nitride bump with an oxide pre-metal dielectric (PMD);
  performing a 1:1 dry etch of the oxide PMD and the nitride bump by a SiCoNi etch, a remote plasma dry etch, or a reactive ion etch (RIE), at an etch rate of 30 to 150 nanometers (nm)/minute to a depth of 30 to 50 nm;
  performing a second dry etch, selective to the oxide PMD, at an etch rate of 30 to 150 nm/minute, to remove any remaining PMD; and
  performing a third dry etch, selective to the SiN cap, by a nitride RIE or a remote plasma dry etch, at an etch rate of 30 to 150 nm/minute, down to the top surface of the polysilicon gate.

* * * * *